United States Patent
Wu et al.

(10) Patent No.: US 11,501,046 B2
(45) Date of Patent: Nov. 15, 2022

(54) PRE-SILICON CHIP MODEL OF EXTRACTED WORKLOAD INNER LOOP INSTRUCTION TRACES

(71) Applicant: International Business Machines Corporation, Armonk, NY (US)

(72) Inventors: Nelson Wu, Austin, TX (US); Daniel Isaac Rodriguez, Austin, TX (US); Miguel Gomez Gonzalez, Zapopan (MX); Shakti Kapoor, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 346 days.

(21) Appl. No.: 16/828,108

(22) Filed: Mar. 24, 2020

(65) Prior Publication Data
US 2021/0303766 A1    Sep. 30, 2021

(51) Int. Cl.
G06F 30/3308    (2020.01)
G06F 11/34    (2006.01)
G06F 9/30    (2018.01)

(52) U.S. Cl.
CPC ...... *G06F 30/3308* (2020.01); *G06F 9/30145* (2013.01); *G06F 11/3461* (2013.01)

(58) Field of Classification Search
CPC ............. G06F 30/3308; G06F 9/30145; G06F 11/3461
See application file for complete search history.

(56) References Cited

U.S. PATENT DOCUMENTS

| | | |
|---|---|---|
| 6,748,526 B1 | 6/2004 | Thangadurai |
| 7,103,517 B2 | 9/2006 | Gluhovsky et al. |
| 7,353,430 B2 | 4/2008 | Derouault et al. |
| 7,401,272 B1 | 7/2008 | Birk et al. |
| 7,506,216 B2 | 3/2009 | Bose et al. |
| 7,617,425 B2 | 11/2009 | Nadeau-Dostie et al. |
| 7,882,000 B2 | 2/2011 | Jones |
| 8,554,535 B2 | 10/2013 | Nohl et al. |
| 8,904,323 B1 | 12/2014 | Kalyanaraman et al. |
| 9,164,846 B2 | 10/2015 | Lang et al. |

(Continued)

FOREIGN PATENT DOCUMENTS

| | | | | |
|---|---|---|---|---|
| CN | 110727584 B | * | 4/2021 | .......... G06F 11/3688 |
| WO | 02097627 A1 | | 12/2002 | |
| WO | WO-2016200723 A1 | * | 12/2016 | .......... G06F 11/2236 |

OTHER PUBLICATIONS

Magnusson et al. "Simics: A full system simulation platform." Computer 35.2 (Aug. 2002): pp. 50-58.

*Primary Examiner* — Stacy Whitmore
(74) *Attorney, Agent, or Firm* — Cantor Colburn LLP; Brian Welle

(57) ABSTRACT

A system is provided to validate a computer processor. The system includes a computing system configured to obtain core dump data including executable instructions corresponding to a code stored in a legacy processor. An instruction-level simulator is installed in the computing system and is configured to simulate the executable instructions to generate a plurality of instruction traces. The system further includes a pre-silicon chip model simulator configured to execute the instruction traces to generate performance data. The computer processor is verified based at least in part on the performance data.

20 Claims, 5 Drawing Sheets

(56) References Cited

U.S. PATENT DOCUMENTS

| | | |
|---|---|---|
| 9,483,374 B2 | 11/2016 | Ethiraj et al. |
| 10,198,333 B2 | 2/2019 | Trobough et al. |
| 10,289,512 B2 | 5/2019 | Bair et al. |
| 10,776,115 B2* | 9/2020 | Burger .................. G06F 9/3853 |
| 10,802,852 B1* | 10/2020 | Wilmot .................... G06F 9/455 |
| 10,990,504 B2* | 4/2021 | Raviv .................... G06F 40/169 |
| 11,010,505 B2* | 5/2021 | Eckmann ................. G06F 9/455 |
| 11,030,075 B2* | 6/2021 | Mola .................... G06F 11/3644 |
| 11,119,787 B1* | 9/2021 | El-Shabani ............ G06F 9/3855 |
| 2003/0154430 A1 | 8/2003 | Allen et al. |
| 2005/0050522 A1* | 3/2005 | Kami .................. G06F 11/3624 |
| | | 717/124 |
| 2007/0011656 A1* | 1/2007 | Kumamoto ............ G06F 11/362 |
| | | 717/124 |
| 2007/0239936 A1 | 10/2007 | Gluhovsky |
| 2009/0125770 A1 | 5/2009 | Parulkar |
| 2009/0199163 A1 | 8/2009 | Soroker et al. |
| 2010/0146338 A1* | 6/2010 | Schalick ............. G06F 11/3656 |
| | | 714/E11.002 |
| 2011/0179309 A1 | 7/2011 | Pathirane et al. |
| 2011/0185153 A1* | 7/2011 | Henry ................. G06F 11/3636 |
| | | 712/30 |
| 2013/0110490 A1* | 5/2013 | Letz ........................ G06F 30/33 |
| | | 703/21 |
| 2015/0095626 A1* | 4/2015 | Nakagawa .......... G06F 9/30145 |
| | | 712/227 |
| 2016/0238657 A1* | 8/2016 | Czamara ............ G01R 31/2834 |
| 2017/0052876 A1* | 2/2017 | Svensson ............ G06F 11/3648 |
| 2017/0091357 A1 | 3/2017 | Brock et al. |
| 2017/0192759 A1 | 7/2017 | Mykland |
| 2018/0203967 A1* | 7/2018 | Chou ...................... G06F 30/39 |
| 2019/0146893 A1 | 5/2019 | Nishi |
| 2019/0227915 A1* | 7/2019 | Anandh ................ G06F 30/331 |
| 2019/0340103 A1* | 11/2019 | Nelson ................ G06F 11/3636 |
| 2019/0384598 A1* | 12/2019 | Chou .................. G06F 9/30043 |
| 2020/0151085 A1* | 5/2020 | Mola .................... G06F 11/3664 |
| 2020/0201778 A1* | 6/2020 | Ludden ............... G06F 30/3308 |
| 2020/0210365 A1* | 7/2020 | Wilkinson .......... G06F 9/30145 |
| 2020/0301809 A1* | 9/2020 | Mola ...................... G06F 9/455 |
| 2020/0310797 A1* | 10/2020 | Corbal ................ G06F 9/30032 |
| 2021/0064513 A1* | 3/2021 | Chadha ............... G06F 11/3636 |
| 2021/0157963 A1* | 5/2021 | Carey ................. G06F 30/3312 |

* cited by examiner

PRE-SILICON CHIP MODEL OF EXTRACTED WORKLOAD INNER LOOP INSTRUCTION TRACES

BACKGROUND

The present invention relates generally to pre-silicon device testing, and more specifically, to validation and testing of new version processor cores.

During the pre-silicon process, devices are tested in a virtual environment with sophisticated simulation, emulation, and formal verification tools. In contrast, post-silicon validation tests occur on actual devices running at-speed in commercial, real-world systems. Pre-silicon testing performs various tests to determine functional correctness and/or to assess the performance of the devices under test (DUT) and/or the system that includes such devices.

SUMMARY

According to a non-limiting embodiment, a system is provided to validate a computer processor. The system includes a computing system configured to obtain core dump data including executable instructions corresponding to a code stored in a legacy processor. An instruction-level simulator is installed in the computing system and is configured to simulate the executable instructions to generate a plurality of instruction traces. The system further includes a pre-silicon chip model simulator configured to execute the instruction traces to generate performance data. The computer processor is verified based at least in part on the performance data.

According to another non-limiting embodiment, a computer-implemented method of validating a computer processor. The computer-implemented method comprises obtaining, by a computing system, core dump data including executable instructions corresponding to a code stored in a legacy processor, and simulating, by an instruction-level simulator, the executable instructions to generate a plurality of instruction traces. The method further comprises executing, by a pre-silicon chip model simulator, the instruction traces to generate performance data; and verifying the computer processor based at least in part on the performance data.

According to yet another non-limiting embodiment, a computer program product configured to validate a computer processor, the computer program product including computer-executed instructions comprising obtaining, by a computing system, core dump data including executable instructions corresponding to a code stored in a legacy processor, and simulating, by an instruction-level simulator, the executable instructions to generate a plurality of instruction traces. The method further comprises executing, by a pre-silicon chip model simulator, the instruction traces to generate performance data; and verifying the computer processor based at least in part on the performance data.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the scope of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Pre-silicon validation is generally performed at a chip, multi-chip or system level. The objective of pre-silicon validation is to verify the correctness and sufficiency of the chip design by subjecting the DUT to real-world-like input stimuli. Pre-silicon validation can be used to verify design correctness, implementation or intent, while also uncovering unexpected system component interactions, inadequate and/or missing functionalities. In assessing functional correctness and performance of a device, instruction traces of inner loops of workloads, including complex third-party workloads, are measured and validated.

Conventional pre-silicon validation approaches typically require modeling the complete system. In some environments, the model of the DUT can be defined using register transfer language (RTL), while other components of the system can be behavioral or bus functional models. However, modeling and verifying the complete system requires extensive time and resources. Moreover, when verifying a new or next generation processor that is undergoing project development, the operating system for the new processor may not yet be available. Even assuming a fully developed OS is available, the running the OS on the chip model will apply an additional load, thereby misrepresenting the actual performance of chip or processor to be verified. Therefore, there is a need to perform pre-silicon verification of a processor without requiring access to a fully designed operating system environment.

Various non-limiting embodiments described herein provide a system configured to extract instruction traces of inner loops for any workload (e.g., a complex third-party workload) without source code access. The system further is configured to execute the extracted instruction traces in a pre-silicon chip model without an OS environment for performance analysis and validation of a newer processor version or next generation of processor core and storage model.

Figure 1:
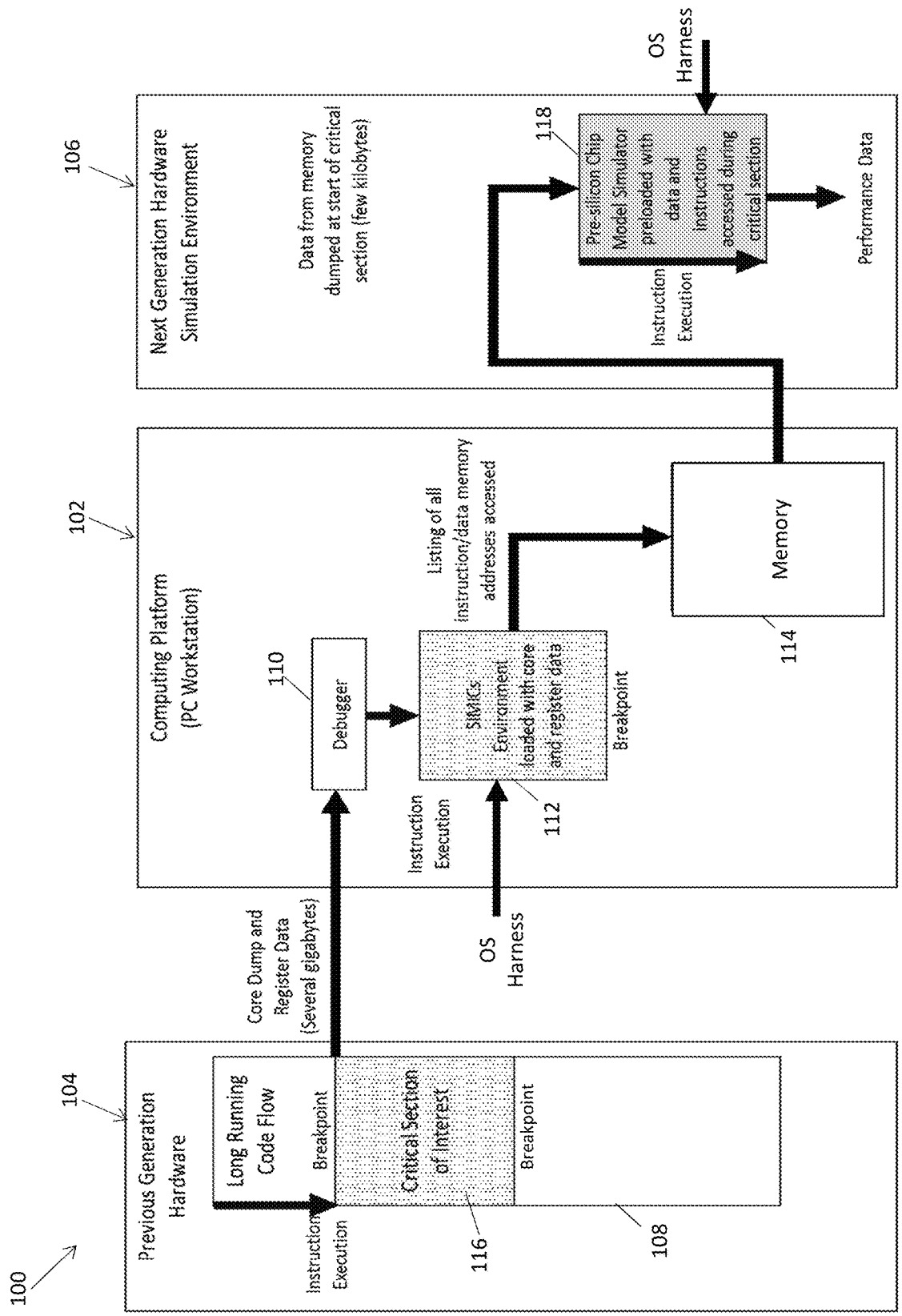
FIG. 1 is a block diagram illustrating configured to validate a computer processor.

Turning now to FIG. 1, a system 100 configured to validate a computer processor is illustrated according to a non-limiting embodiment. The system 100 includes a computing system 102 configured to receive one or more inputs from a DUT 104 and to output data to a device simulation system 106. The DUT 104 includes, for example, a previous generation processor 104 (also referred to as legacy processor) configured to execute computer code 108 associated with a workload such as, for example, a complex third-party workload.

The system 100 can be employed as a work station computer, for example, and includes a debugger module 110, one or more local instruction-level simulators 112 such as, for example, "Simics," and a memory unit 114. In one or more embodiments, the debugger module 110 can be implemented using the "GNU debugger" (GDB). The debugger module 110 is configured to run the workload and stop execution at a location of interest 116. The location of interest 116 can include a location in the code prior to entering an inner loop. In response to stopping execution, the debugger module 110 can obtain a core dump, which contains all instructions pages, data pages and register values included in the location of interest 116. Obtaining the core dump data eliminates the need to obtain the source code associated with the section of interest 116.

Following the core dump, the debugger module 110 can load the obtained core dump data associated with the section of interest 116 into the instruction-level simulator 112. In addition, a customized bare metal operating system (OS) harness (sometimes referred to as an OS model) is generated and loaded into the instruction-level simulator 112. The bare metal OS harness includes partial and abstracted segments of code that act as a fully functional OS capable of facilitating processor verification. The instruction-level simulator 112 then runs through a set number of loops without requiring the source code application or workload. The set number of loops can change (i.e., set by a developer) depending on the processor or chip to be verified. After completing the set number loops, the instruction-level simulator 112 dumps the simulated results from the execution of the instructions into the memory unit 114. The simulated results include, but are not limited to, instruction traces, touched data pages, and one or more page tables corresponding to the location of interest 116.

The device simulation system 106 includes a pre-silicon chip model simulator 118. The pre-silicon chip model simulator 118 is loaded with the OS harness, along with chip data defining the next generation processor. The chip data includes the dumped page table and instruction traces stored in the memory unit 114. Once loaded, the pre-silicon chip model simulator 118 can run the instruction traces for a set number of iterations associated with an inner loop of a given application or workload. In response to running the instruction traces, the pre-silicon chip model simulator 118 outputs performance data, which can be analyzed to verify operation of the modeled next generation processor. The performance data includes, for example, performance counters, core all events traces (AETs), core nest traces, front side traces, and back side traces.

As described above, the core dump data associated with the code's section of interest 116 along with the customized OS harness allows the extracted instruction traces to be executed in a pre-silicon chip model to perform analysis and validation of a newer processor version or next generation of processor core and storage model without the need to obtain the source code and a fully designed OS environment. Accordingly, a more accurate representation of the chip performance can be determined. Moreover, the ability to verify a virtualized next generation processor using the inner loops avoids the need to mode and verifying the complete system. In this manner, modeling and verification time can be decreased, while also reducing costs.

Figure 2:
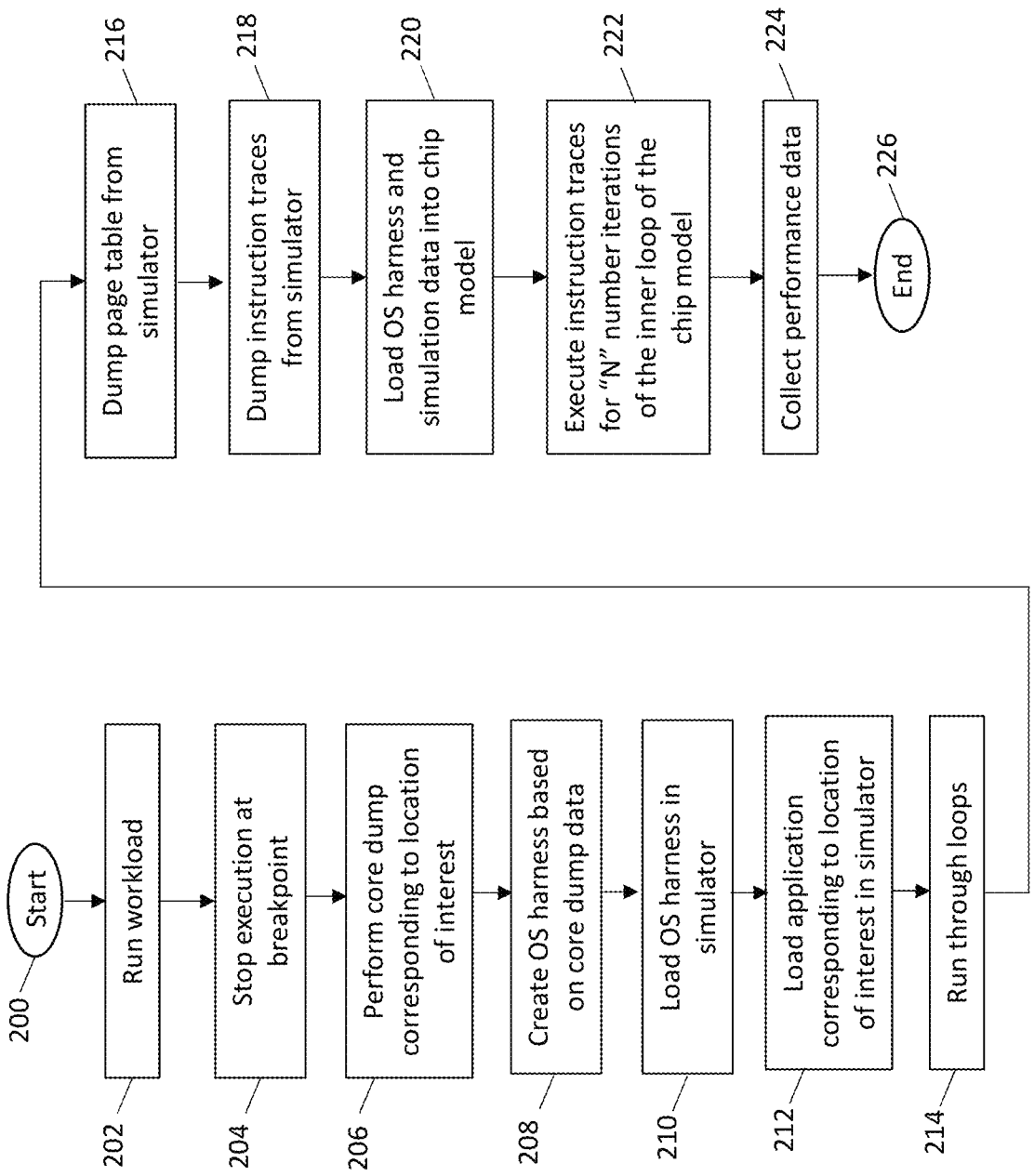
FIG. 2 is a flow diagram illustrating a method of verifying a computer processor.

Turning now to FIG. 2, a flow diagram illustrates a method of verifying a computer processor according to a non-limiting embodiment of the invention. The method begins at operation 200 and at operation 202 the code associated with a workload (e.g., a complex third-party workload) is run. At operation 204, the running code is stopped at breakpoint. In one or more embodiments, the breakpoint is located prior to entering an inner loop and indicates a location of interest within the code. The location of interest can be associated, for example, with a given application or workload.

At operation 206, a core dump is performed by a debugger module. The core dump obtains core dump data corresponding with the location of interest. The core dump data includes, for example, all instructions pages, data pages and register values included in the location of interest. At operation 208, a customized OS harness based, at least in part, on the core dump data is generated. The customized OS harness can be generated by running the instructions associated with the core dump data so as to proceed through each next instruction address (NIA) until reaching an ending breakpoint in the core dump data. In one or more embodiments, the instructions can be run by returning from all system call or other exceptions without handling. While running the instruction-level simulator runs through the instructions, any translation faults are resolved and a virtual translation table is generated. Accordingly, effective addresses (EAs) are properly mapped to a sequence of real addresses (RAs) in the virtual translation page table.

Turning to operation 210, the customized OS harness is loaded into an instruction-level simulator included in the computing system, and at operation 212 the application associated with the location of interest is loaded into the instruction-level simulator. At operation 214, the instruction-level simulator runs through a set number of loops of the loaded application. At operation 216, a page table is dumped from the instruction-level simulator into a memory unit, and at operation 218 instruction traces are dumped from the instruction-level simulator into a memory unit.

Turning to operation 220, the dumped simulation data stored in the memory unit along with the OS harness are loaded into a pre-silicon chip model simulator included in a device simulation system. At operation 222, the pre-silicon chip model simulator executes the instruction traces for a set number (n) of iterations of a given inner loop associated with the application. At operation 224, performance data output by the pre-silicon chip model simulator in response to simulating the application is collected, and the method ends at operation 226. The performance data output by the pre-silicon chip model simulator includes, but is not limited to, performance counters, core application engine traces, all events traces (AETs), core nest traces, front side traces, and back side traces. In this manner, a pre-silicon chip model to perform analysis and validation of a newer processor version or next generation of processor core and storage model without the need to obtain the source code and a fully designed OS environment.

Although a detailed description on cloud computing is described in greater detail below, it should be appreciated that the implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 3:
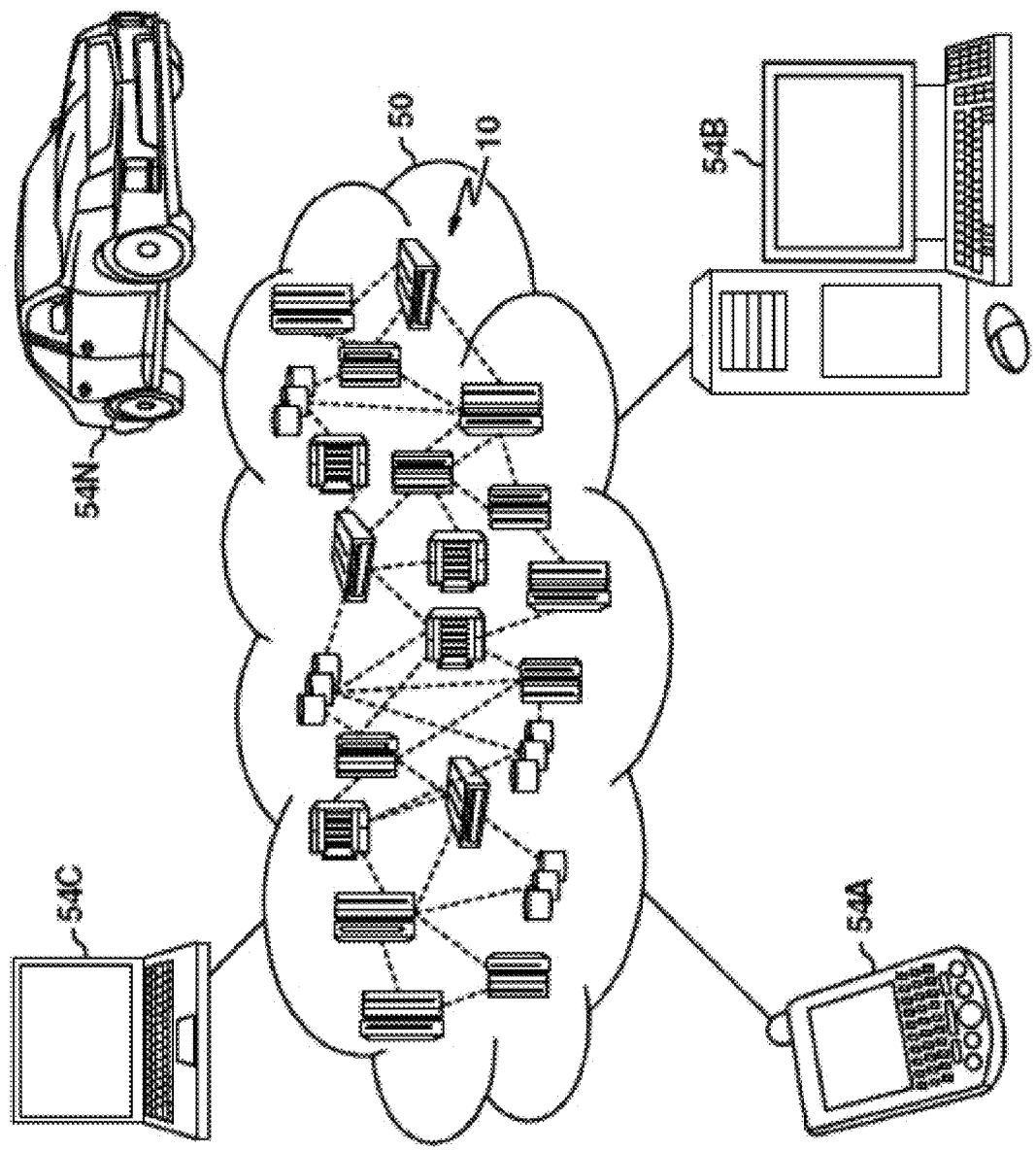
FIG. 3 depicts a cloud computing environment according to one or more embodiments described herein.

Referring now to FIG. 3, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 3 are intended to be illustrative only and that computing nodes 10 and cloud computing environment 50 can communicate with any type of computerized device over any type of network and/or network addressable connection (e.g., using a web browser).

Figure 4:
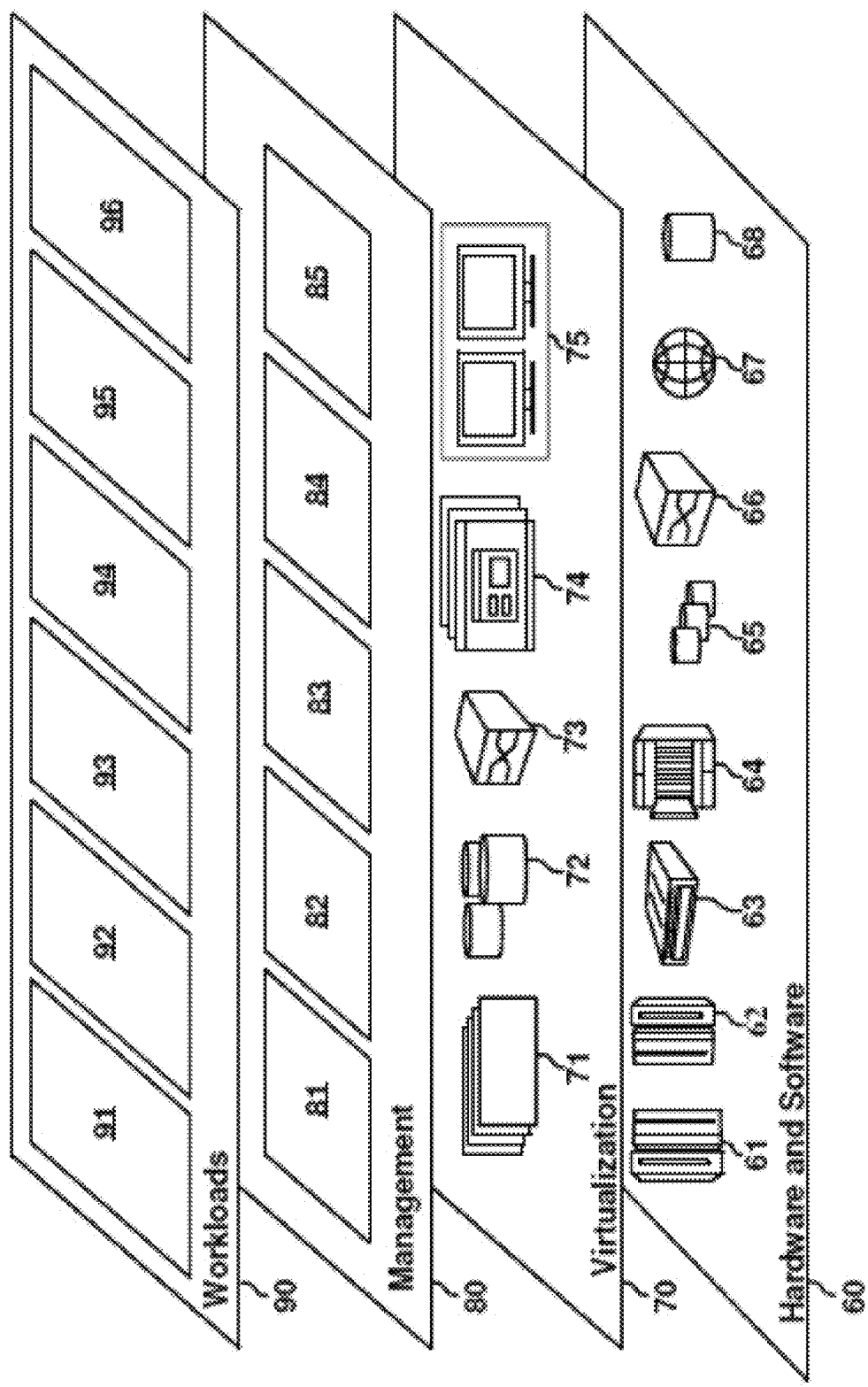
FIG. 4 depicts abstraction model layers according to one or more embodiments described herein.

Referring now to FIG. 4, a set of functional abstraction layers provided by cloud computing environment 50 (FIG. 3) is shown. It should be understood in advance that the components, layers, and functions shown in FIG. 4 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and training a neural network 96.

Figure 5:
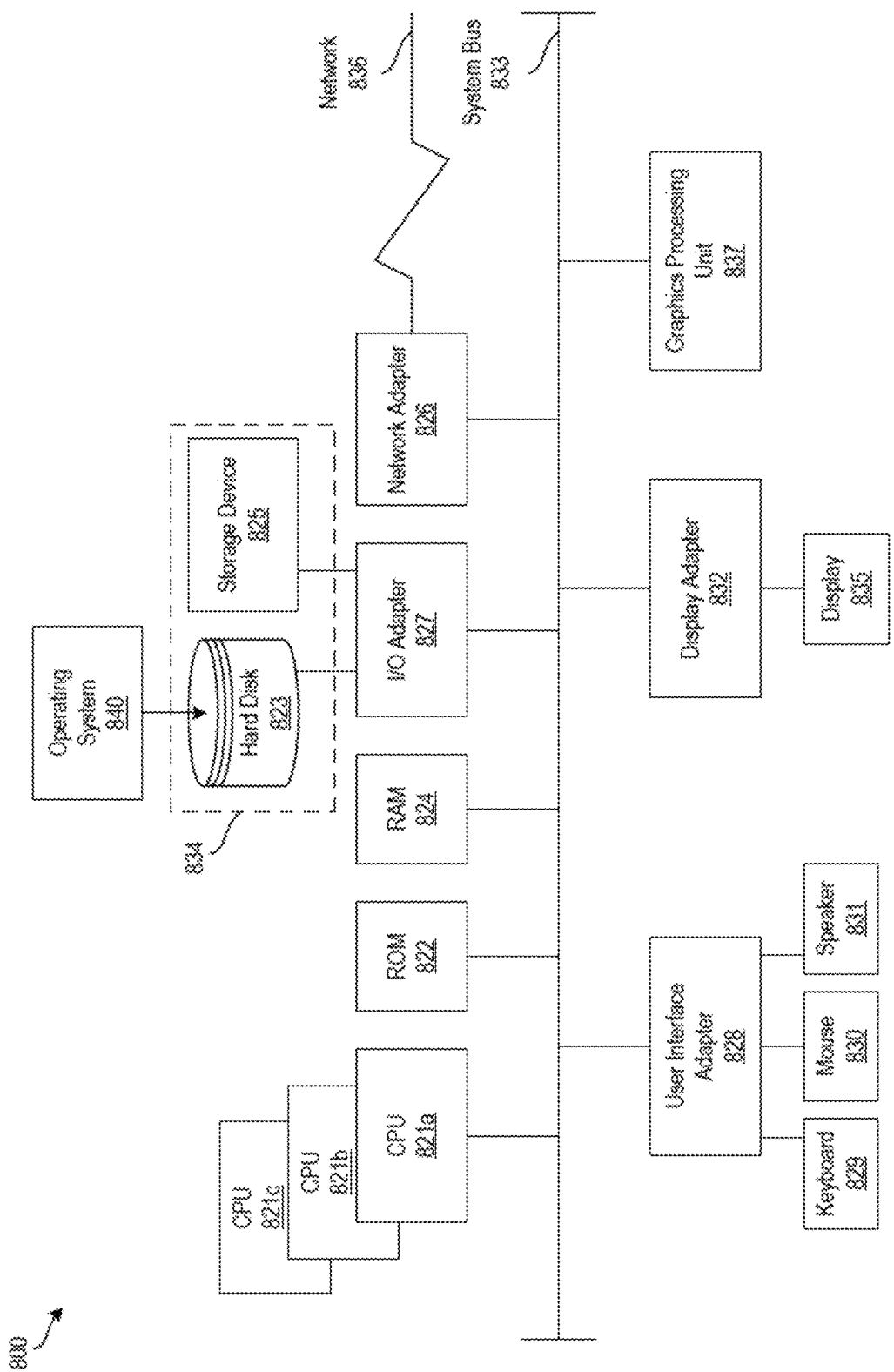
FIG. 5 depicts a block diagram of a processing system for implementing the presently described techniques according to one or more embodiments described herein.

It is understood that one or more embodiments described herein is capable of being implemented in conjunction with any other type of computing environment now known or later developed. For example, FIG. 5 depicts a block diagram of a processing system 800 for implementing the techniques described herein. In accordance with one or more embodiments described herein, the processing system 800 is an example of a cloud computing node 10 of FIG. 3. In examples, processing system 800 has one or more central processing units ("processors" or "processing resources") 821a, 821b, 821c, etc. (collectively or generically referred to as processor(s) 821 and/or as processing device(s)). In aspects of the present disclosure, each processor 821 can include a reduced instruction set computer (RISC) microprocessor. Processors 821 are coupled to system memory (e.g., random access memory (RAM) 824) and various other components via a system bus 833. Read only memory (ROM) 822 is coupled to system bus 833 and may include a basic input/output system (BIOS), which controls certain basic functions of processing system 800.

Further depicted are an input/output (I/O) adapter 827 and a network adapter 826 coupled to system bus 833. I/O adapter 827 may be a small computer system interface (SCSI) adapter that communicates with a hard disk 823 and/or a storage device 825 or any other similar component. I/O adapter 827, hard disk 823, and storage device 825 are collectively referred to herein as mass storage 834. Operating system 840 for execution on processing system 800 may be stored in mass storage 834. The network adapter 826 interconnects system bus 833 with an outside network 836 enabling processing system 800 to communicate with other such systems.

A display (e.g., a display monitor) 835 is connected to system bus 833 by display adapter 832, which may include a graphics adapter to improve the performance of graphics intensive applications and a video controller. In one aspect of the present disclosure, adapters 826, 827, and/or 832 may be connected to one or more I/O busses that are connected to system bus 833 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 833 via user interface adapter 828 and display adapter 832. A keyboard 829, mouse 830, and speaker 831 may be interconnected to system bus 833 via user interface adapter 828, which may include, for example, a Super I/O chip integrating multiple device adapters into a single integrated circuit.

In some aspects of the present disclosure, processing system 800 includes a graphics processing unit 837. Graphics processing unit 837 is a specialized electronic circuit designed to manipulate and alter memory to accelerate the creation of images in a frame buffer intended for output to a display. In general, graphics processing unit 837 is very efficient at manipulating computer graphics and image processing, and has a highly parallel structure that makes it more effective than general-purpose CPUs for algorithms where processing of large blocks of data is done in parallel.

Thus, as configured herein, processing system 800 includes processing capability in the form of processors 821, storage capability including system memory (e.g., RAM 824), and mass storage 834, input means such as keyboard 829 and mouse 830, and output capability including speaker 831 and display 835. In some aspects of the present disclosure, a portion of system memory (e.g., RAM 824) and mass storage 834 collectively store the operating system 840 such as the AIX® operating system from IBM Corporation to coordinate the functions of the various components shown in processing system 800.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of validating a computer processor, the computer-implemented method comprising:
    obtaining, by a computing system, core dump data including executable instructions corresponding to a code stored in a legacy processor being a previous generation with respect to the computer processor;
    simulating, by an instruction-level simulator, the executable instructions to generate a plurality of instruction traces, wherein simulating the executable instructions comprises:
        generating a customized operating system (OS) harness based at least on part on the core dump data;
        loading the customized OS harness in the instruction-level simulator; and
        running, via the customized OS harness, a set number of loops of the executable instructions;
    loading the customized OS harness and the instruction traces in a pre-silicon chip model simulator;
    executing, by the pre-silicon chip model simulator, the instruction traces using the customized OS harness to generate performance data; and
    verifying the computer processor based at least in part on the performance data.

2. The computer-implemented method of claim 1, wherein the performance data includes at least one of core application engine traces, all events traces (AETs), core nest traces, front side traces, and back side traces.

3. The computer-implemented method of claim 1, wherein obtaining the core dump data comprises:
    executing, by a debugger module included in the computing system, the executable instructions;
    stopping execution of the executable instruction at a location of interest in response to detecting a breakpoint; and
    performing a core dump that includes the core dump data corresponding to the location of interest.

4. The computer-implemented method of claim 3, wherein the breakpoint is located prior to entering an inner loop included in the executable instructions.

5. The computer-implemented method of claim 4, wherein the core dump data includes at least one of instruction pages, data pages, and register values.

6. The computer-implemented method of claim 5, wherein generating the customized OS harness includes generating a virtual translation table based on the location of interest.

7. The computer-implemented method of claim 1, wherein the customized OS harness includes partial and abstracted segments of code based on the core dump data capable of verifying the computer processor.

8. A system configured to validate a computer processor, the system comprising:
    a computing system configured to obtain core dump data including executable instructions corresponding to a code stored in a legacy processor being a previous generation with respect to the computer processor, and configured to generate a customized operating system harness based at least in part on the core dump data;
    an instruction-level simulator installed in the computing system, the instruction-level simulator loaded with the customized OS harness, the instruction-level simulator configured to simulate the executable instructions using the customized OS harness to generate a plurality of instruction traces; and
    a pre-silicon chip model simulator loaded with the plurality of instruction traces and the customized OS, the pre-silicon chip model simulator configured to execute the instruction traces using the customized OS to generate performance data,
    wherein the computer processor is verified based at least in part on the performance data.

9. The system of claim 8, wherein the performance data includes at least one of core application engine traces, all events traces (AETs), core nest traces, front side traces, and back side traces.

10. The system of claim 8, wherein the computing system includes a debugger module that executes the executable instructions, detects a detecting a breakpoint in the while executing the executable instructions, stops execution of the execution of the executable instruction at a location of interest in response to detecting the break point, and performs a core dump that includes the core dump data corresponding to the location of interest.

11. The system of claim 10, wherein the breakpoint is located prior to entering an inner loop included in the executable instructions.

12. The system of claim 11, wherein the core dump data includes at least one of instruction pages, data pages, and register values.

13. The system of claim 12, wherein the customized OS harness includes a virtual translation table based on the location of interest.

14. The system of claim 8, wherein the customized OS harness includes partial and abstracted segments of code based on the core dump data capable of verifying the computer processor.

15. A computer program product comprising a computer readable storage medium having program instructions embodied therewith, the program instructions executable by a processor to cause the processor to perform operations comprising:

obtaining, by a computing system, core dump data including executable instructions corresponding to a code stored in a legacy processor being a previous generation with respect to the computer processor, the core dump data including at least one of instruction pages, data pages, and register values;

simulating, by an instruction-level simulator, the executable instructions to generate a plurality of instruction traces, wherein simulating the executable instructions comprises:

generating a customized operating system (OS) harness based at least on part on the core dump data;

loading the customized OS harness in the instruction-level simulator; and running, via the customized OS harness, a set number of loops of the executable instructions;

loading the instruction traces and the customized OS harness in a pre-silicon chip model simulator;

executing, by the pre-silicon chip model simulator, the instruction traces using the customized OS harness to generate performance data; and verifying the computer processor based at least in part on the performance data.

16. The computer program product of claim 15, wherein the performance data includes at least one of core application engine traces, all events traces (AETs), core nest traces, front side traces, and back side traces.

17. The computer program product of claim 15, wherein obtaining the core dump data comprises:

executing, by a debugger module included in the computing system, the executable instructions;

stopping execution of the executable instruction at a location of interest in response to detecting a breakpoint; and performing a core dump that includes the core dump data corresponding to the location of interest.

18. The computer program product of claim 17, wherein the breakpoint is located prior to entering an inner loop included in the executable instructions.

19. The computer program product of claim 15, wherein generating the customized OS harness includes generating a virtual translation table based on the location of interest.

20. The computer program product of claim 15, wherein the customized OS harness includes partial and abstracted segments of code based on the core dump data capable of verifying the computer processor.

* * * * *